United States Patent
Lindgren et al.

(10) Patent No.: US 7,859,114 B2
(45) Date of Patent: Dec. 28, 2010

(54) IC CHIP AND DESIGN STRUCTURE WITH THROUGH WAFER VIAS DISHING CORRECTION

(75) Inventors: Peter J. Lindgren, Essex Junction, VT (US); Edmund J. Sprogis, Underhill, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 12/181,467

(22) Filed: Jul. 29, 2008

(65) Prior Publication Data

US 2010/0025857 A1 Feb. 4, 2010

(51) Int. Cl.
H01L 23/48 (2006.01)
H01L 23/52 (2006.01)
H01L 29/40 (2006.01)
H01L 29/06 (2006.01)
H01L 23/053 (2006.01)
H01L 23/12 (2006.01)

(52) U.S. Cl. ............... 257/774; 257/621; 257/622; 257/700; 257/E21.578; 257/E21.585; 257/E21.586; 257/E21.587; 257/E21.588; 257/E21.597

(58) Field of Classification Search ......... 257/621–622, 257/774, E21.577, E21.578, E21.585, E21.586, 257/E21.587, E21.588, E21.597, 700
See application file for complete search history.

(56) References Cited

U.S. PATENT DOCUMENTS

| | | | |
|---|---|---|---|
| 5,970,367 A | 10/1999 | Wanlass | |
| 6,069,068 A | 5/2000 | Rathore et al. | |
| 6,130,161 A | 10/2000 | Ashley et al. | |
| 6,133,139 A | 10/2000 | Dalal et al. | |
| 6,162,743 A | 12/2000 | Chu et al. | |
| 6,258,710 B1 | 7/2001 | Rathore et al. | |
| 6,287,954 B1 | 9/2001 | Ashley et al. | |
| 6,294,835 B1 | 9/2001 | Dalal et al. | |
| 6,348,731 B1 | 2/2002 | Ashley et al. | |
| 6,355,528 B1 | 3/2002 | Ishida et al. | |
| 6,429,099 B1 * | 8/2002 | Christensen et al. | 438/480 |
| 6,657,242 B1 * | 12/2003 | Norstrom et al. | 257/197 |
| 6,964,897 B2 * | 11/2005 | Bard et al. | 438/243 |
| 7,247,560 B1 | 7/2007 | Kinner et al. | |
| 7,253,527 B2 * | 8/2007 | Tanida et al. | 257/774 |
| 2004/0262767 A1 * | 12/2004 | Matsuo | 257/758 |
| 2007/0190692 A1 | 8/2007 | Erturk et al. | |
| 2009/0039471 A1 * | 2/2009 | Katagiri | 257/620 |

(Continued)

OTHER PUBLICATIONS

U.S. Appl. No. 12/181,359, Amendment To Office Action dated May 5, 2010, filed Jul. 12, 2010, 11 pages.

(Continued)

Primary Examiner—Ida M Soward
(74) Attorney, Agent, or Firm—Anthony J. Canale; Hoffman Warnick LLC

(57) ABSTRACT

An IC chip and design structure having a TWV contact contacting the TWV and extending through a second dielectric layer over the TWV. An IC chip may include a substrate; a through wafer via (TWV) extending through at least one first dielectric layer and into the substrate; a TWV contact contacting the TWV and extending through a second dielectric layer over the TWV; and a first metal wiring layer over the second dielectric layer, the first metal wiring layer contacting the TWV contact.

19 Claims, 10 Drawing Sheets

U.S. PATENT DOCUMENTS

| | | | |
|---|---|---|---|
| 2009/0068835 A1* | 3/2009 | La Tulipe et al. | 438/656 |
| 2009/0160058 A1* | 6/2009 | Kuo et al. | 257/758 |
| 2009/0191708 A1* | 7/2009 | Kropewnicki et al. | 438/667 |
| 2009/0269905 A1* | 10/2009 | Chen et al. | 438/424 |
| 2009/0302480 A1* | 12/2009 | Birner et al. | 257/774 |
| 2009/0315154 A1* | 12/2009 | Kirby et al. | 257/621 |

OTHER PUBLICATIONS

U.S. Appl. No. 12/181,359, Office Action dated May 5, 2010, 9 pages.

* cited by examiner

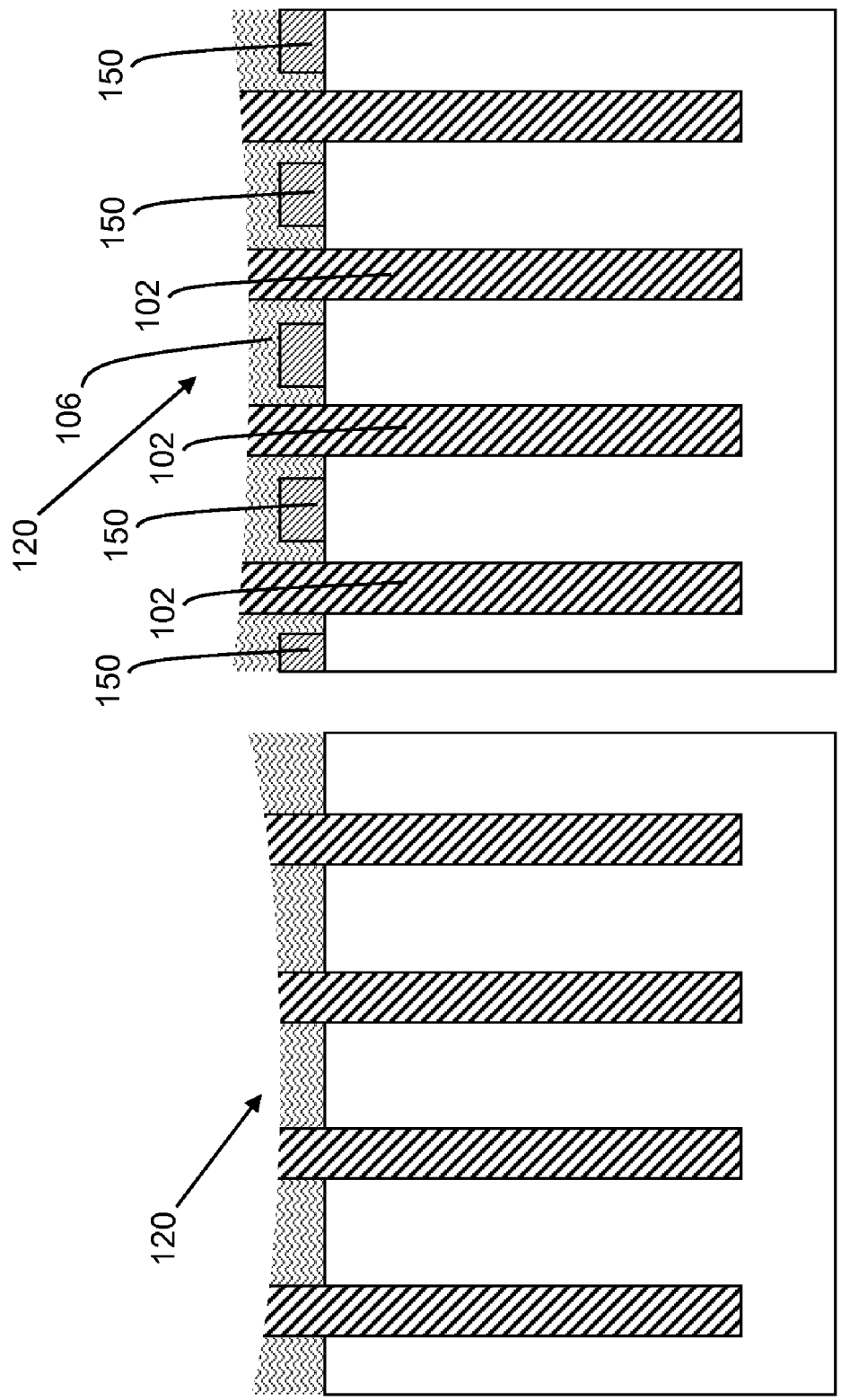

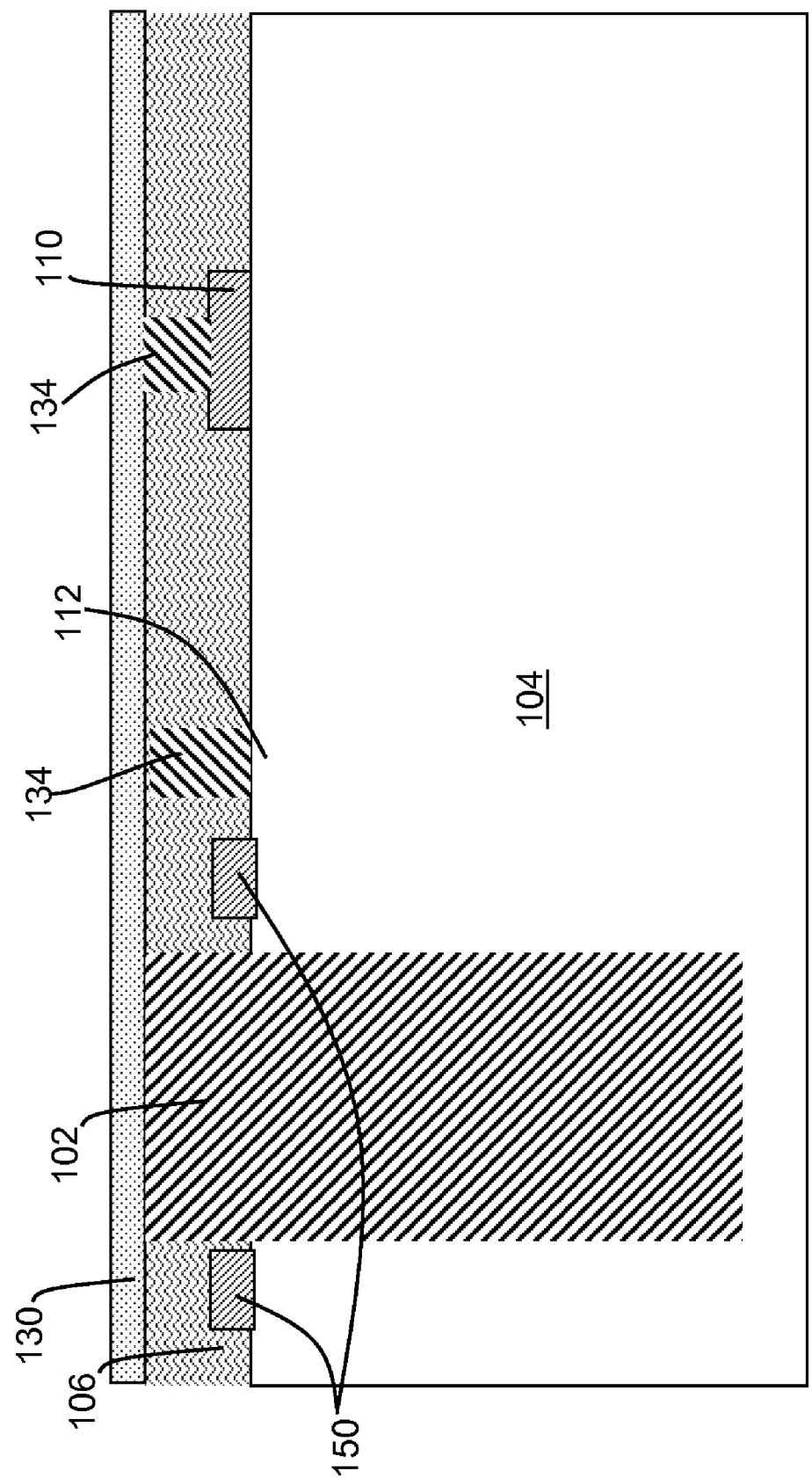

IC CHIP AND DESIGN STRUCTURE WITH THROUGH WAFER VIAS DISHING CORRECTION

CROSS-REFERENCE TO RELATED APPLICATIONS

This application is related to U.S. Ser. No. 12/181,359, filed Jul. 29, 2008, currently pending.

BACKGROUND

1. Technical Field

The disclosure relates generally to integrated circuit (IC) chip fabrication, and more particularly, to methods and structure relating to through wafer vias.

2. Background Art

Through waver vias (TWVs), also known as through silicon vias (TSVs), have dimensions that are relatively large compared to other structures in current IC chip technology. For example, TWVs have dimensions on the order of 4 micrometers (μm) wide by 10 μm long. The large width results in a very high local pattern factor during chemical mechanical polish (CMP) of the TWVs at the contact level. Consequently, severe topography (approximately 100 nanometers (nm) or greater) may result due to dishing or erosion during CMP. For aluminum-copper (AlCu) back-end-of-line (BEOL) structures this situation is not an issue since the sub-etch AlCu process fully removes the AlCu films. For a damascene copper (Cu) process, however, this situation presents a problem because the topography causes the tantalum liner or copper (Ta/Cu) deposition to result in large puddles of material, causing shorts. A secondary issue with advanced BEOL technologies, such as 130 nm or beyond, is that titanium nitride and tungsten (TiN/W) metallization processes used for the TWVs cannot simultaneously fill both the TWV and the standard contacts.

SUMMARY

Methods of forming through wafer vias (TWVs) and standard contacts in two separate processes to prevent copper first metal layer puddling and shorts are presented. In one embodiment, a method may include forming a TWV into a substrate and a first dielectric layer over the substrate; forming a second dielectric layer over the substrate and the TWV; forming, through the second dielectric layer, at least one contact to the TWV and at least one contact to other structures over the substrate; and forming a first metal wiring layer over the second dielectric layer, the first metal wiring layer contacting at least one of the contacts.

An IC chip and design structure are also presented having a TWV contact contacting the TWV and extending through a second dielectric layer over the TWV. An IC chip may include a substrate; a through wafer via (TWV) extending through at least one first dielectric layer and into the substrate; a TWV contact contacting the TWV and extending through a second dielectric layer over the TWV; and a first metal wiring layer over the second dielectric layer, the first metal wiring layer contacting the TWV contact.

A first aspect of the disclosure provides a method comprising: forming a through wafer via (TWV) into a substrate and a first dielectric layer over the substrate; forming a second dielectric layer over the substrate and the TWV; forming, through the second dielectric layer, at least one contact to the TWV and at least one contact to other structures over the substrate; and forming a first metal wiring layer over the second dielectric layer, the first metal wiring layer contacting at least one of the contacts.

A second aspect of the disclosure provides a method comprising: forming a through wafer via (TWV) into a substrate and a first dielectric layer over the substrate, the TWV extending at least approximately 20 micrometers deep into the substrate; forming dummy polyconductor shapes about the TWV in the first dielectric layer; forming a second dielectric layer over the substrate; planarizing the second dielectric layer; forming, through the second dielectric layer, at least one contact to the TWV and at least one contact to other structure over the substrate; planarizing the at least one contact; and forming a first copper wiring layer over the second dielectric layer, the first copper wiring layer contacting at least one of the contacts.

A third aspect of the disclosure provides a method comprising: forming a through wafer via (TWV) into a substrate and a first dielectric layer over the substrate and at least one contact through the first dielectric layer to a structure in the substrate; forming a second dielectric layer over the substrate; and forming a first metal wiring layer through the second dielectric layer, the first metal wiring layer contacting the at least one contact and the TWV.

A fourth aspect of the disclosure provides an integrated circuit (IC) chip comprising: a substrate; a through wafer via (TWV) extending through at least one first dielectric layer and into the substrate; a TWV contact contacting the TWV and extending through a second dielectric layer over the TWV; and a first metal wiring layer over the second dielectric layer, the first metal wiring layer contacting the TWV contact.

A fifth aspect of the disclosure provides a design structure embodied in a machine readable medium for designing, manufacturing, or testing an integrated circuit, the design structure comprising: an integrated circuit (IC) chip comprising: a substrate; a through wafer via (TWV) extending through at least one first dielectric layer and into the substrate; a TWV contact contacting the TWV and extending through a second dielectric layer over the TWV; and a first metal wiring layer over the second dielectric layer, the first metal wiring layer contacting the TWV contact.

A sixth aspect of the disclosure provides an integrated circuit (IC) chip comprising: a substrate; a through wafer via (TWV) extending through at least one first dielectric layer and into the substrate; a TWV contact contacting the TWV and extending through a second dielectric layer over the TWV; a contact extending through the second dielectric layer to contact other structure in or over the substrate; a plurality of dummy polyconductor shapes about the TWV in the first dielectric layer; and a first metal wiring layer over the second dielectric layer, the first metal wiring layer contacting the TWV contact.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 6A-7B show alternative embodiments for the methods.

FIGS. 8-9 show another embodiment of a method, with FIG. 6 showing an IC chip according to the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
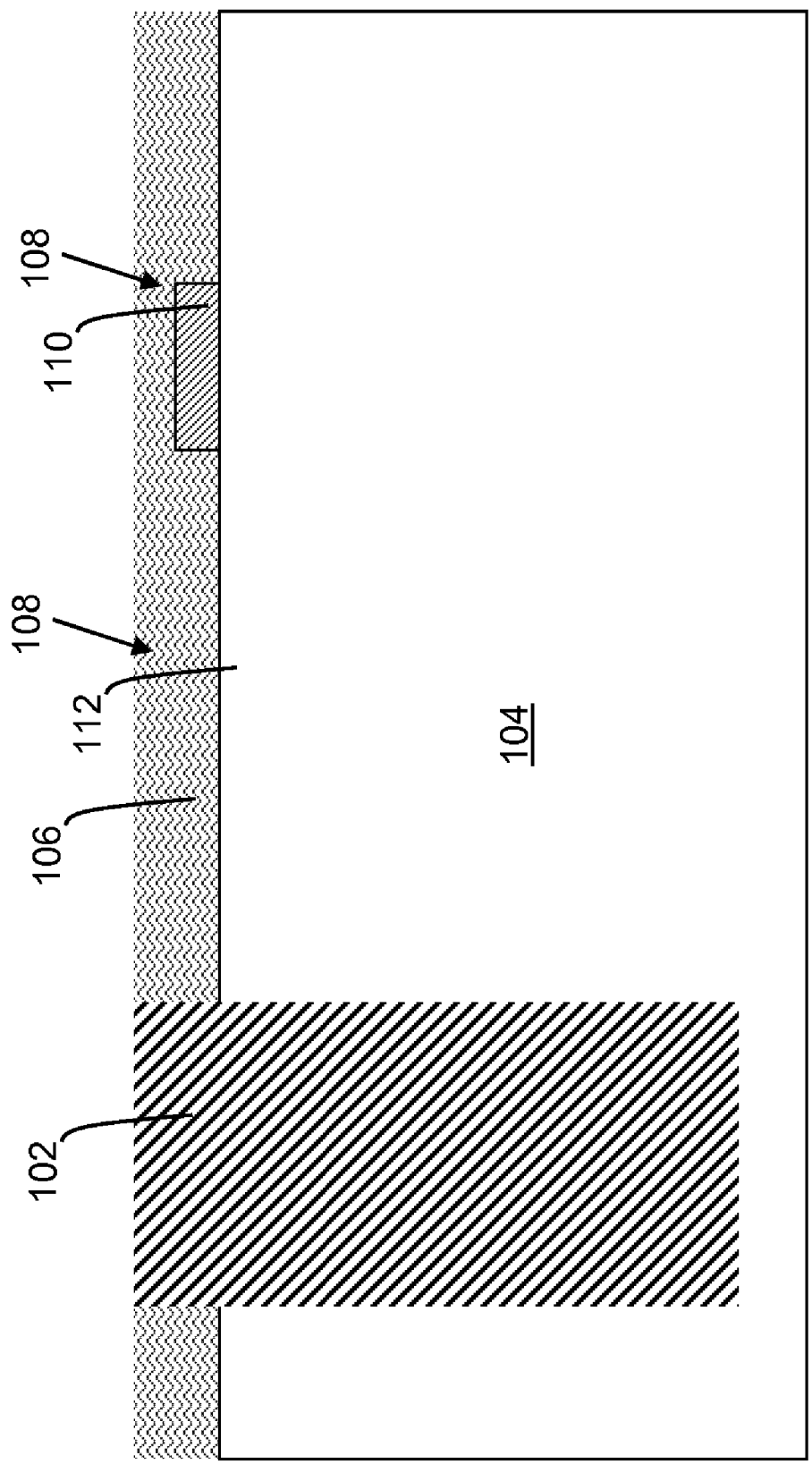
FIGS. 1-5 show one embodiment of a method, with FIG. 3 showing an IC chip according to the disclosure.
Figure 2:
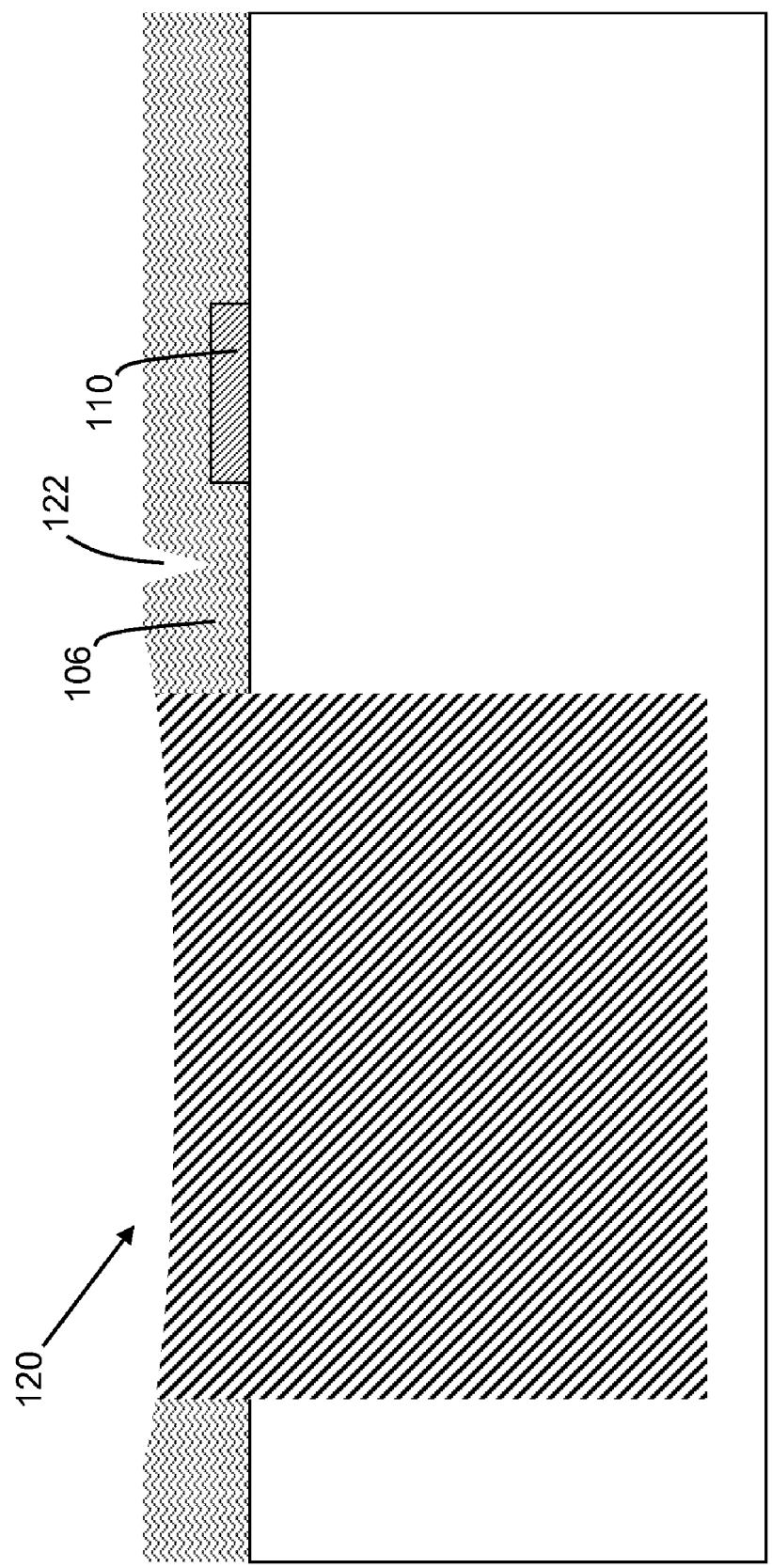
Figure 3:
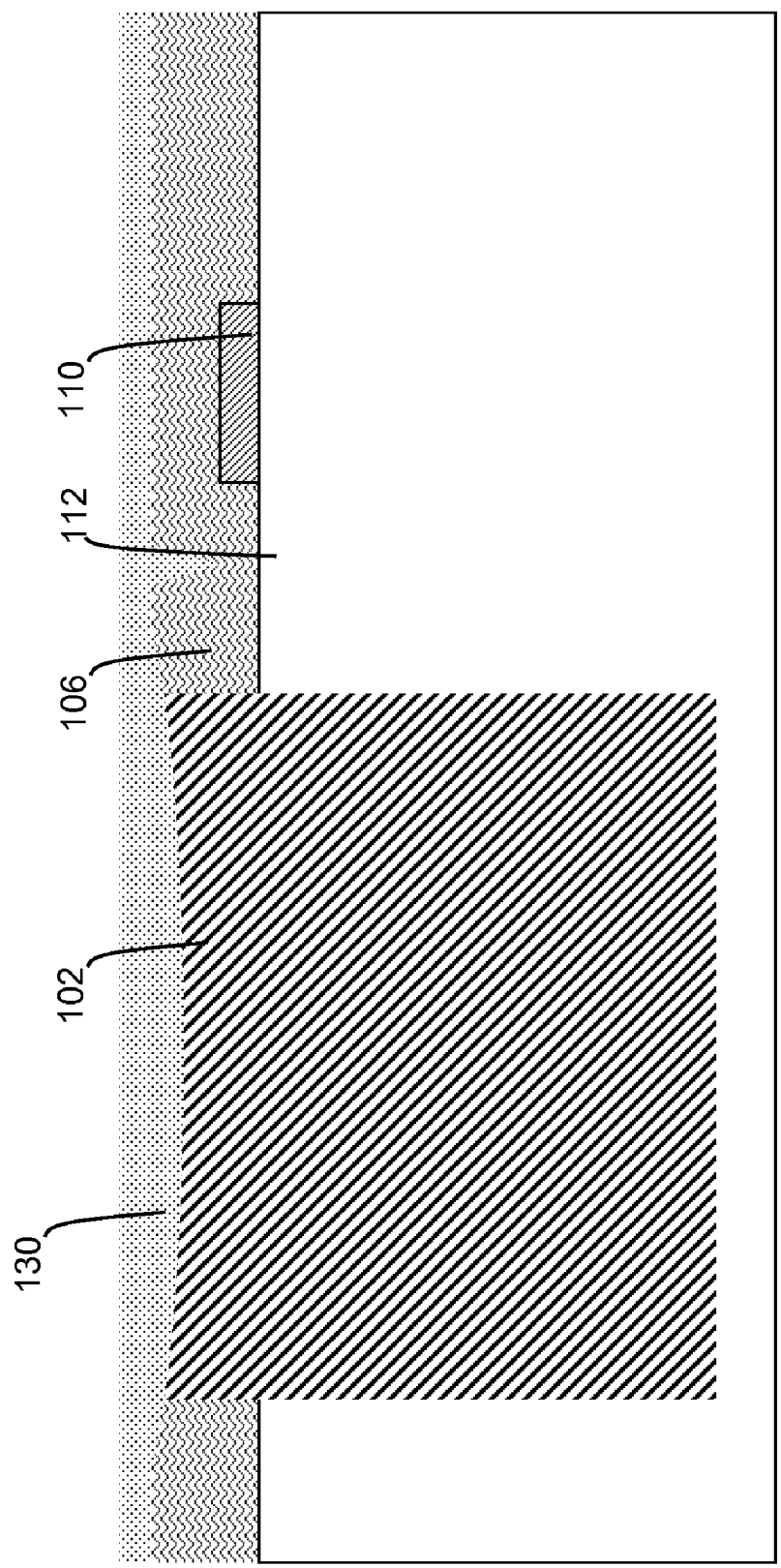

Turning to the drawings, FIGS. 1-3 show one embodiment of a method, with FIG. 3 showing an IC chip 100 according to the disclosure. FIG. 1 shows an initial process including forming a through wafer via (TWV) 102 into a substrate 104 and a first dielectric layer 106 over substrate 104. Substrate 104 may include, but is not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). First dielectric layer 106 may include, but is not limited to: silicon nitride ($Si_3N_4$) and boro-phospho-silicate glass (BPSG), boro-phospho-silicate glass (BPSG) and phospho-silicate glass (PSG), silicon dioxide ($SiO_2$) or SiCOH.

In contrast to conventional interconnect contacts, TWV 102 is at least approximately 20 micrometers deep into substrate 104. In one embodiment, TWV 102 includes tungsten (W). As understood in the art, a refractory metal liner (not shown) may also be used. TWV 102 may be formed using any now known or later developed process such as, patterning a mask, etching an opening, depositing a liner and metal. Other structure 108 may also be formed over or in substrate 102 using any now known or later developed techniques. For example, other structure 108 may include at least one circuit element 110 such as a transistor (e.g., polysilicon conductor), a capacitor, a resistor, an inductor, diffusion area 112 or other now known or late developed IC chip circuit element(s).

Alternative methods of making TWVs 102 may include patterning and etching them prior to FET and other passive and active device formation, filling them with sacrificial materials such as polysilicon, fabricating the FETs and other passive and active devices, and subsequently removing the sacrificial polysilicon and refilling with a conductor such as tungsten. These TWVs could either be shorted to the substrate or insulated from the substrate. If they are insulated from the substrate, then an insulator such as $SiO_2$ is deposited or grown prior to the sacrificial polysilicon deposition.

The final process in forming TWV 102 includes planarization using, for example, a chemical mechanical polish (CMP). FIG. 2 shows an enlarged view of a TWV after CMP, which exhibits dishing 120 or erosion. Cracks 122 may also be created in first dielectric layer 106 during this process. As noted herein, for a damascene copper (Cu) process, this situation presents a problem because the topography causes the tantalum/copper (Ta/Cu) deposition to result in large puddles of material, causing shorts.

As shown in FIG. 3, in order to address this situation, a second dielectric layer 130 is formed over substrate 104 and TWV 102. Second dielectric layer 130 may include any now known or later developed interlayer dielectric such as but not limited to: silicon nitride ($Si_3N_4$), silicon dioxide ($SiO_2$), fluorinated $SiO_2$ (FSG), hydrogenated silicon oxycarbide (Si-COH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available form JSR Corporation, other low dielectric constant (<3.9) material, or layers thereof. Consequently, any dishing 120 (FIG. 2) or cracks 122 (FIG. 2) are filled by second dielectric layer 130. If desired, second dielectric layer 130 may be planarized (e.g., via CMP) after the forming thereof to provide a very smooth, flat surface for forming a metal wiring layer thereon.

Figure 4:
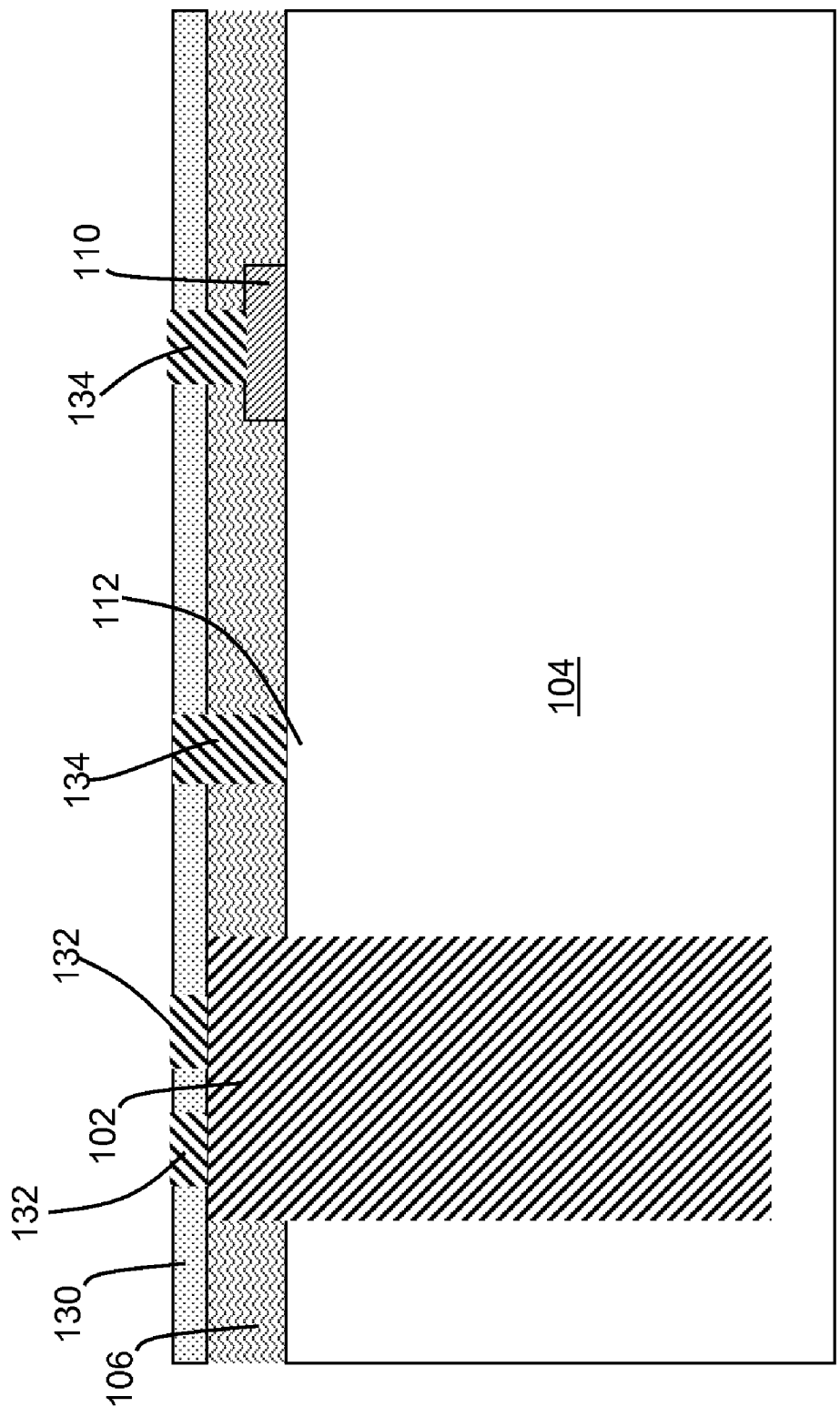

FIG. 4 shows forming, through second dielectric layer 130, at least one contact 132 to TWV 102 and at least one contact 134 to other structure(s) 108 over or in substrate 104. That is, TWV contact(s) 132 are formed simultaneously with interconnect contact(s) 134 in second dielectric layer 130. In one embodiment, contacts 132, 134 includes tungsten (W). As understood in the art, a refractory metal liner (not shown) may also be used. Contacts 132, 134 may be formed using any now known or later developed process such as, patterning a mask, etching an opening, depositing a liner and metal. If necessary, planarization may be performed after contact(s) 132, 134 are formed.

Figure 5:
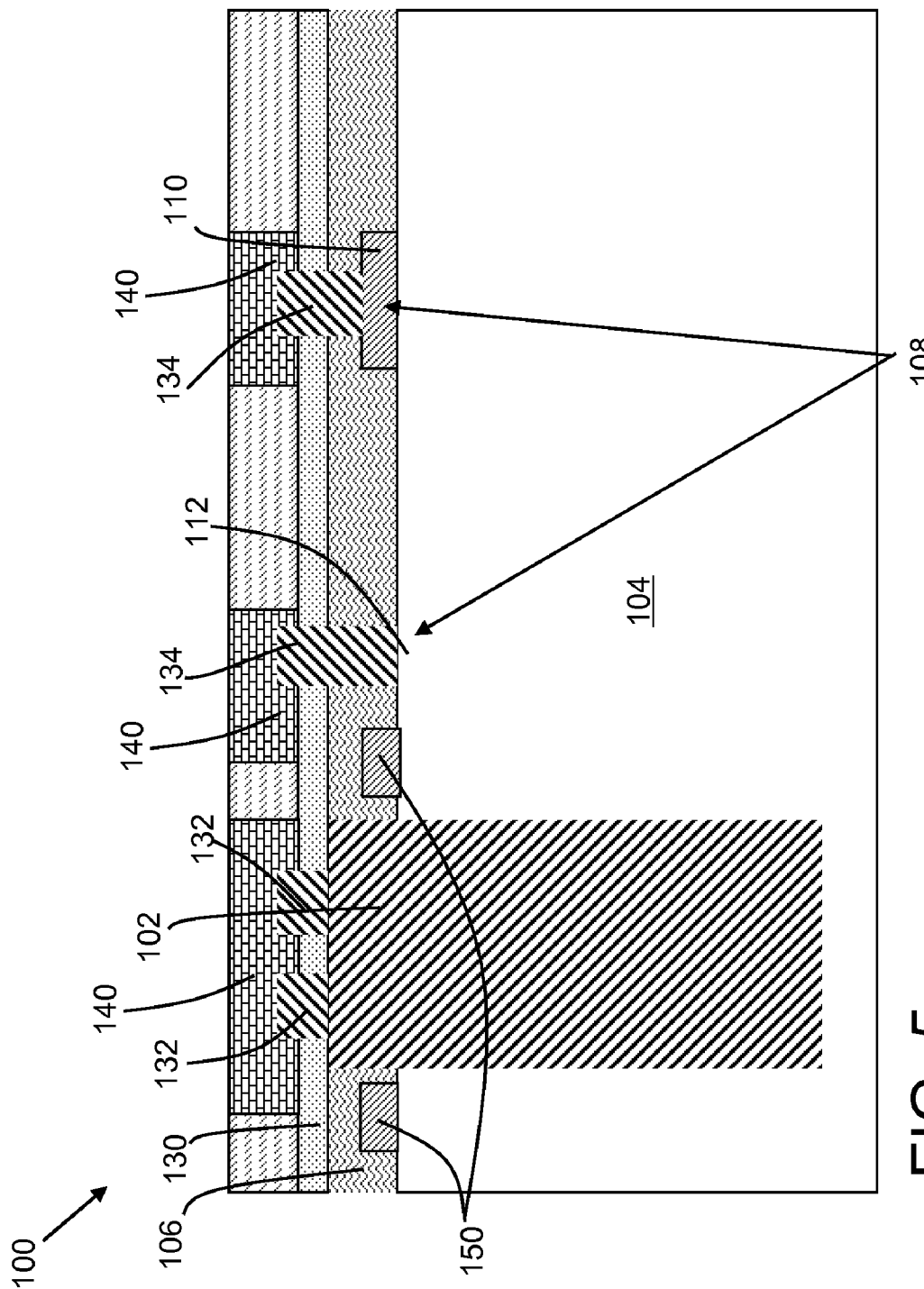
Figure 6B:
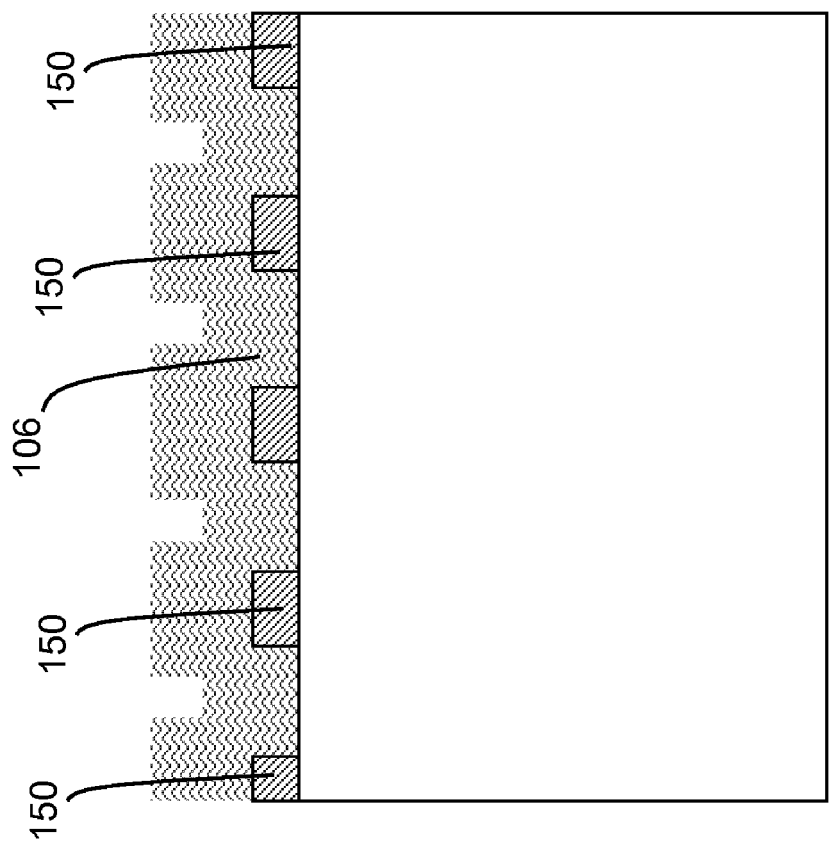
Figure 6A:
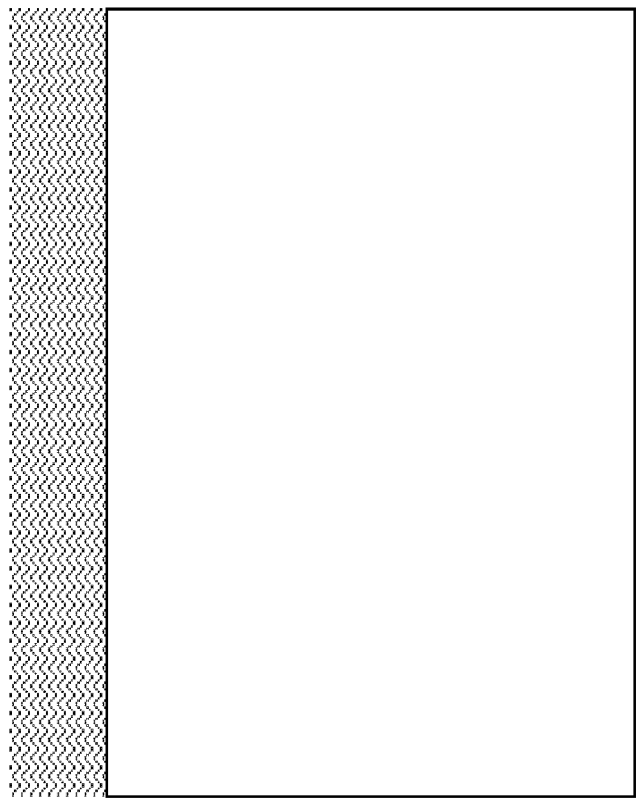

FIG. 5 shows forming a first metal wiring layer 140 over second dielectric layer 130, the first metal wiring layer 140 contacting at least one of contact(s) 132, 134. First metal wiring layer 140 may be formed using any now known or later developed technique. However, the teachings of the present disclosure find advantage relative to Damascene processing. In particular, since second dielectric layer 130 provides a smoother, flatter surface compared to conventional situations, the topography does not cause puddling of material such as a tantalum liner or copper (Ta/Cu). In one embodiment, first metal wiring layer 140 includes copper (Cu), however, other conductors may also be used.

FIGS. 6A-7B show an alternative embodiment in which a plurality of dummy polyconductor shapes 150 are formed about a TWV 102 in first dielectric layer 106. As illustrated by comparing FIGS. 6A-6B, dummy polyconductor shapes 150 raise a level of first dielectric layer 106. As illustrated by comparing FIGS. 7A-7B, the raised dielectric helps reduce dishing 120 (FIGS. 7A-7B) or erosion during planarization after TWV formation.

Returning to FIG. 5, IC chip 100 formed according to the above-described method may include substrate 104, TWV(s) 102 extending through at least one first dielectric layer 130 and into substrate 104. TWV contact(s) 132 may contact TWV 102 and extend through second dielectric layer 130 over the TWV. Further, first metal wiring layer 140 may extend over second dielectric layer 130 and contact TWV contact(s) 132 (and contact(s) 134). Contact(s) 134 may also extend through second dielectric layer 130 to contact other structure 108 in or over substrate 104. Dummy polyconductor shapes 150 may be provided about TWV 102 in first dielectric layer 106.

Figure 9:
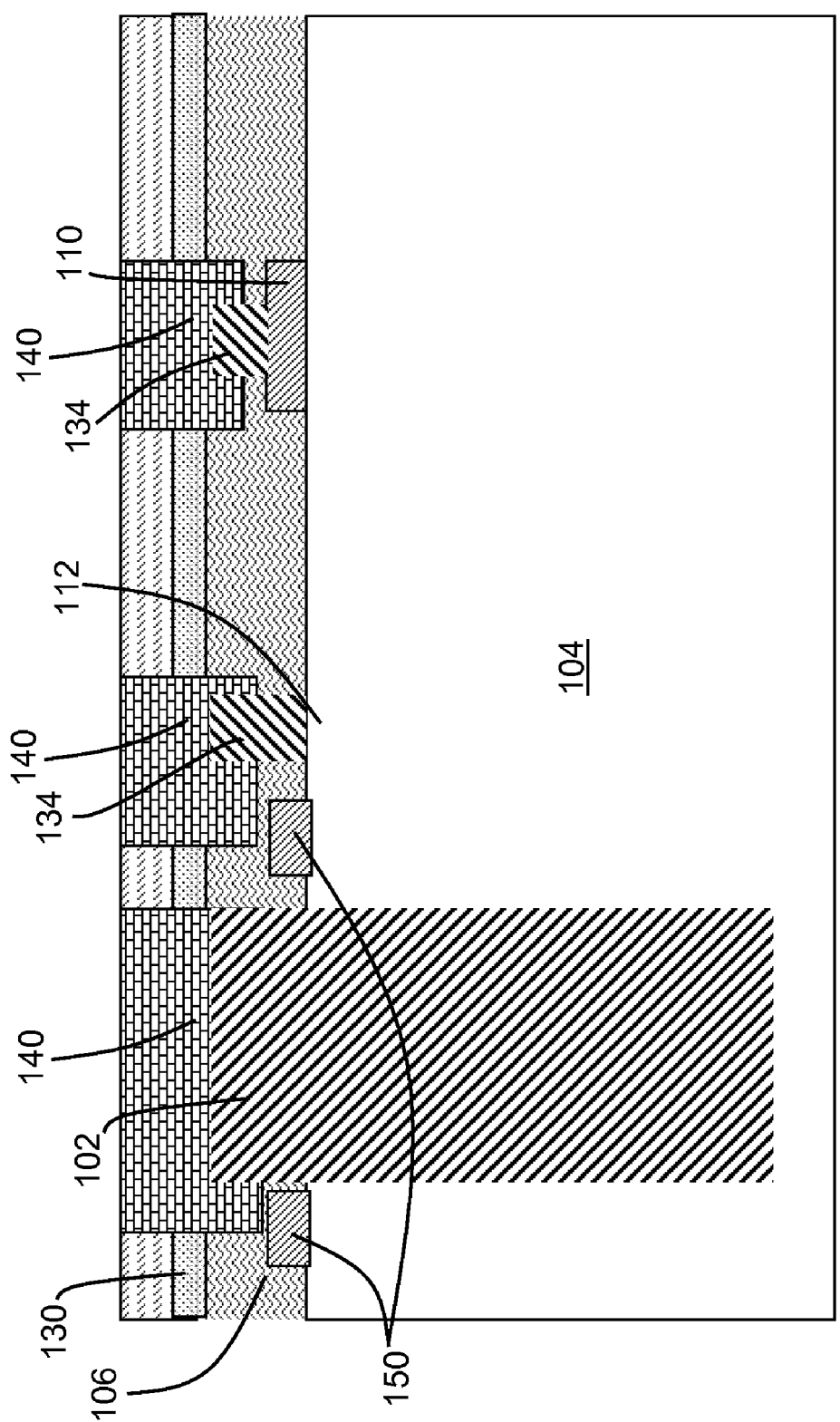

Referring to FIGS. 8-9, another embodiment of a method according to the disclosure is illustrated. In this embodiment, as shown in FIG. 8, TWV 102 is formed into substrate 104 and first dielectric layer 106 over substrate 104. In addition, at least one contact 134 is formed through first dielectric layer 106 to structure 108 in or on substrate 104. A second dielectric layer 130 is formed over substrate 104. Second dielectric layer 130 may be planarized. These processes are performed in a substantially similar manner to that described above. The alternative embodiment described relative to FIGS. 6A-7B may also be applied to this embodiment. In contrast to the above-described embodiment, however, in this embodiment, no TWV contacts 132 (FIG. 5) are made. Rather, as shown in FIG. 9, first metal wiring layer 140 is formed through second dielectric layer 130 to directly contact contact(s) 134 and TWV 102. First metal wiring layer 140 may be formed using any now known or later developed technique, but the teachings of the present disclosure find advantage relative to Damascene processing. In particular, since second dielectric layer 130 provides a smoother, flatter surface compared to conventional situations, the topography does not cause puddling of material such as a tantalum liner or copper (Ta/Cu).

Figure 10:
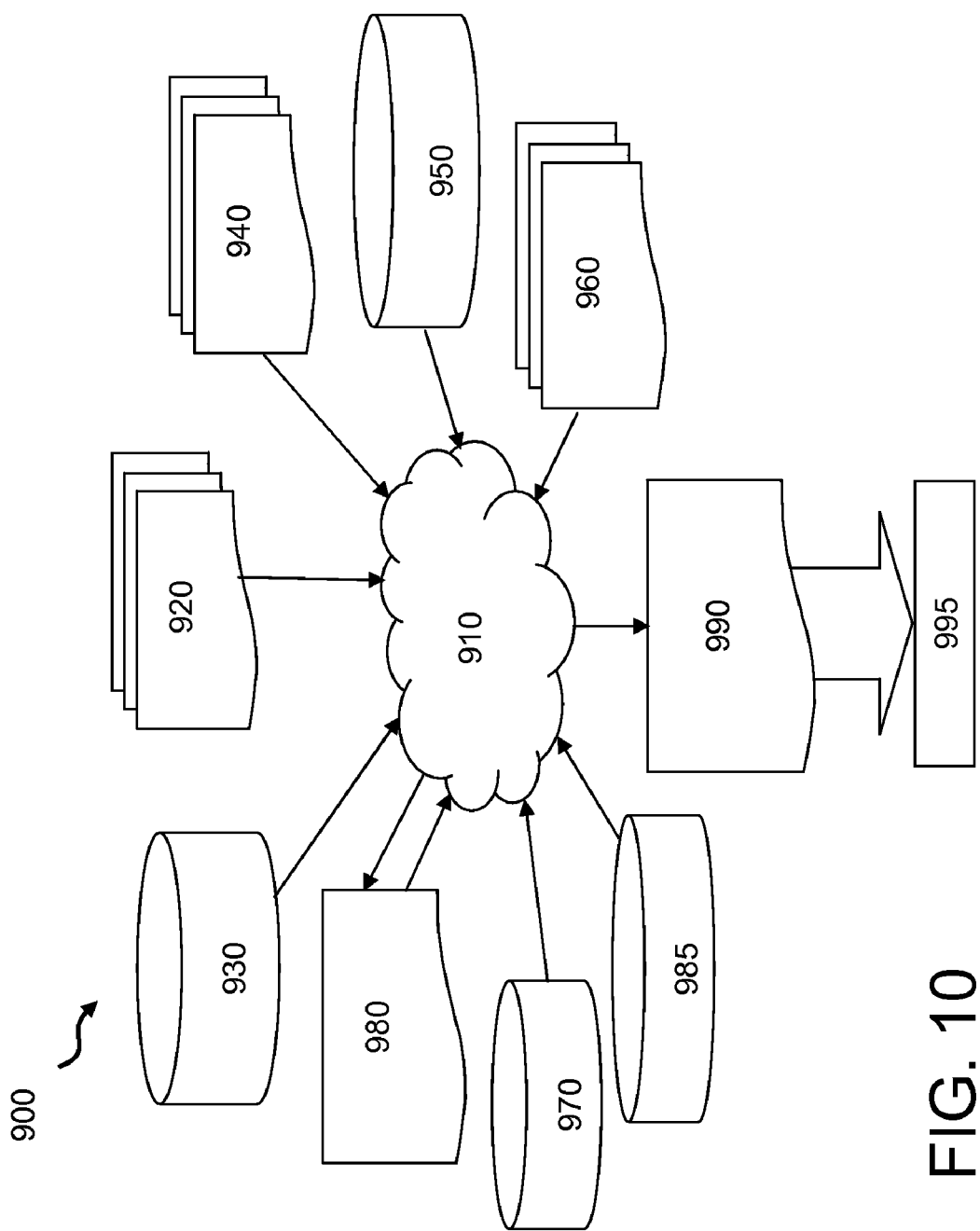
FIG. 10 shows a flow diagram of a design process used in semiconductor design, manufacture, and/or test.

FIG. 10 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIG. 5 or 9 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIG. 5 or 9. Design process 910 preferably synthesizes (or translates) an embodiment of the invention as shown in FIG. 5 or 9 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 5 or 9, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 5 or 9. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) chip comprising:
   a substrate;
   a through wafer via (TWV) extending through at least one first dielectric layer and into the substrate;
   a TWV contact contacting the TWV and extending through a second dielectric layer over the TWV, wherein the TWV contact and the TWV include tungsten (W); and
   a first metal wiring layer over the second dielectric layer, the first metal wiring layer contacting the TWV contact.

2. The IC chip of claim 1, further comprising a contact extending through the second dielectric layer to contact other structure in or over the substrate.

3. The IC chip of claim 2, wherein the other structure includes at least one circuit element selected from the group consisting of: a transistor, a capacitor, a resistor and an inductor.

4. The IC chip of claim 1, wherein the first metal wiring layer includes copper (Cu).

5. The IC chip of claim 1, wherein the TWV is at least approximately 20 micrometers deep into the substrate.

6. The IC chip of claim 1, wherein the first dielectric layer is selected from a group consisting of: silicon nitride (Si3N4) and boro-phospho-silicate glass (BPSG), boro-phospho-silicate glass (BPSG) and phospho-silicate glass (PSG), silicon dioxide (SiO2), and SiCOH.

7. The IC chip of claim 1, further comprising dummy polyconductor shapes about the TWV in the first dielectric layer.

8. A design structure embodied in a machine readable medium for designing, manufacturing, or testing an integrated circuit, the design structure comprising:
   an integrated circuit (IC) chip comprising:
   a substrate;
   a through wafer via (TWV) extending through at least one first dielectric layer and into the substrate;
   a TWV contact contacting the TWV and extending through a second dielectric layer over the TWV, wherein the TWV contact and the TWV include tungsten (W); and
   a first metal wiring layer over the second dielectric layer, the first metal wiring layer contacting the TWV contact.

9. The design structure of claim 8, wherein the design structure comprises a netlist.

10. The design structure of claim 8, wherein the design structure resides on storage medium as a data format used for the exchange of layout data of integrated circuits.

11. The design structure of claim 8, wherein the design structure includes at least one of test data, characterization data, verification data, or design specifications.

12. The design structure of claim 8, further comprising a contact extending through the second dielectric layer to contact other structure in or over the substrate.

13. The design structure of claim 12, wherein the other structure includes at least one circuit element selected from the group consisting of: a transistor, a capacitor, a resistor and an inductor.

14. The design structure of claim 8, further comprising dummy polyconductor shapes about the TWV in the first dielectric layer.

15. An integrated circuit (IC) chip comprising:
   a substrate;
   a through wafer via (TWV) extending through at least one first dielectric layer and into the substrate;
   a TWV contact contacting the TWV and extending through a second dielectric layer over the TWV;
   a contact extending through the second dielectric layer to contact other structure in or over the substrate;
   a plurality of dummy polyconductor shapes about the TWV in the first dielectric layer; and
   a first metal wiring layer over the second dielectric layer, the first metal wiring layer contacting the TWV contact.

16. The IC chip of claim 15, wherein the TWV contact, the TWV and the contact include tungsten (W).

17. The IC chip of claim 15, wherein the TWV is at least approximately 20 micrometers deep into the substrate.

18. The IC chip of claim 15, wherein the other structure includes at least one circuit element selected from the group consisting of: a transistor, a capacitor, a resistor and an inductor.

19. The IC chip of claim 15, wherein the first dielectric layer is selected from a group consisting of: silicon nitride (Si3N4) and boro-phospho-silicate glass (BPSG), boro-phospho-silicate glass (BPSG) and phospho-silicate glass (PSG), silicon dioxide (SiO2), and SiCOH.

* * * * *